United States Patent [19]

Deal et al.

[11] Patent Number: 5,139,571
[45] Date of Patent: Aug. 18, 1992

[54] NON-CONTAMINATING WAFER POLISHING SLURRY

[75] Inventors: Paul W. Deal, Scottsdale; Dennis B. Werho, Chandler, both of Ariz.

[73] Assignee: Motorola, Inc., Schaumburg, Ill.

[21] Appl. No.: 690,237

[22] Filed: Apr. 24, 1991

[51] Int. Cl.$^5$ .................................................. C09G 1/00
[52] U.S. Cl. ........................................ 106/3; 51/293; 51/308; 501/96
[58] Field of Search .................. 51/308, 293; 106/3; 501/96

[56] References Cited

U.S. PATENT DOCUMENTS

| | | | |
|---|---|---|---|
| 3,807,979 | 4/1974 | Cromwell | 51/308 |
| 4,022,625 | 5/1977 | Shelton | 106/3 |
| 4,057,939 | 11/1977 | Basi | 106/3 |
| 4,462,188 | 7/1984 | Payne | 51/308 |

Primary Examiner—William R. Dixon, Jr.
Assistant Examiner—Willie J. Thompson
Attorney, Agent, or Firm—Joe E. Barbee

[57] ABSTRACT

A semiconductor wafer polishing slurry that does not contaminate a wafer processing area utilizes an aqueous organic base to suspend the slurry's fine abrasive particles. The organic base has large cations (13,16,19) that do not diffuse into semiconductor wafers. Therefore ionic contamination from the polishing slurry is substantially eliminated.

17 Claims, 1 Drawing Sheet

NON-CONTAMINATING WAFER POLISHING SLURRY

BACKGROUND OF THE INVENTION

The present invention relates, in general, to manufacturing of semiconductor devices, and more particularly, to slurries used to polish semiconductor wafers.

Polishing of semiconductor wafers was a common technique often used by the semiconductor industry to planarize semiconductor wafers, and to reduce the thickness of semiconductor wafers. Wafer polishing operations generally used an aqueous slurry which typically included fine abrasive particles that were suspended in a strong alkali metal base, such as potassium hydroxide (KOH) or sodium hydroxide (NaOH). The base adjusted the slurry's pH value to ensure that the abrasive remained in suspension, to assist in chemical removal of material from the wafer, to maximize removal rate, and to ensure surface smoothness. Although the polishing operations were generally performed in an enclosed polishing apparatus, alkali cations such as sodium ions (Na$^+$) or potassium ions (K$^+$) escaped from the slurry. The cations were small mobile ions that contaminated a wafer processing area and the wafers in the area by rapidly diffusing through the wafer processing area, contacting wafers in the area, and diffusing into the wafers. Semiconductor devices produced from the contaminated wafers had numerous defects including high leakage current, surface inversion, low breakdown voltage, and inferior semiconductor device performance.

Accordingly, it is desirable to have a wafer polishing slurry that does not contain highly mobile ions, that does not contaminate the environment of a semiconductor wafer processing area, and that does not cause inferior semiconductor device performance.

SUMMARY OF THE INVENTION

Briefly stated, the present invention is achieved by utilizing an aqueous organic base to suspend the abrasive particles of a semiconductor wafer polishing slurry. The organic base has large cations that are not as mobile as alkali cations. The large cations of the organic base do not diffuse into semiconductor wafers. Therefore ionic contamination from the polishing slurry is substantially eliminated.

DETAILED DESCRIPTION OF THE DRAWINGS

The present invention provides a wafer polishing slurry that does not contaminate semiconductor wafers. An organic base is utilized to adjust the slurry's pH value. Since the organic base has large cations that are not very mobile, ionic concentrations in the vicinity of polishing operations are reduced and the ionic concentrations decrease dramatically with increased distance from the polishing area. Additionally, the large organic base cations do not diffuse into semiconductor wafers, therefore ionic contamination from the polishing slurry is substantially eliminated.

While the invention is described with specific preferred embodiments, it is evident that many alternatives and variations will be apparent to those skilled in the semiconductor arts. More specifically the slurry has been described for a particular quaternary ammonium base and a particular silica abrasive, although the method of using large molecules with low mobility is directly applicable to other organic base compounds, to other abrasive materials, and to other semiconductor materials.

Figure 1:
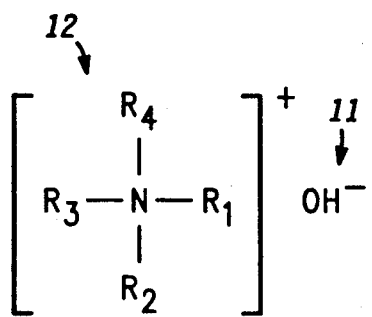
FIG. 1 is a schematic illustration of a general configuration of a quaternary ammonium base molecule.

Referring to FIG. 1, a quaternary ammonium base has a general structure of $[N-(R_1R_2R_3R_4)]^+OH^-$ and includes a quaternary ammonium ion 12 as a cation and a hydroxide ion (OH$^-$) 11 as an anion. Quaternary ammonium ion 12 has a nitrogen atom (N) that is bonded to four radicals $R_1$, $R_2$, $R_3$, and $R_4$. A wafer polishing slurry can be created from a quaternary ammonium base by adding water and an abrasive such as fumed silica, silica, or cerium oxide. Hydroxide ion (OH$^-$) 11 assists in depolymerizing oxide bonds on the surface of the wafer thereby accelerating the abrasive removal of material from the wafer's surface. Consequently, it is important for the slurry to have a high pH which provides large numbers of hydroxide ions to assist in the removal process. If the slurry's pH value is too high, the abrasive particles will be dissolved into the suspension. The proper pH value depends on the size and type of the abrasive particles in addition to the type of alkyl or alkanol radicals in the base and the desired removal rate. Typical pH values range from approximately 8.0 to approximately 11.0 depending upon particle size and the slurry's required removal rate.

The polishing slurry must also have high mass transport at the interface between the slurry and a wafer. That is, the slurry must be able to transport removed material away from a wafer before the base's hydroxide ions chemically redeposit the material back onto the wafer. Consequently, the radicals chosen for $R_1$, $R_2$, $R_3$, and $R_4$ must provide a strong quaternary ammonium base that can be utilized in creating a slurry that has high mass transfer at the silicon wafer to slurry interface yet ammonium ion 12 must have a size that minimizes migration through a wafer processing area and prevents diffusion into a semiconductor wafer.

The present invention utilizes alkyl and/or alkanol radicals for at least two of the radicals $R_1$, $R_2$, $R_3$, and $R_4$ to achieve a strong quaternary ammonium base that can provide a high mass transport slurry that does not contaminate a wafer processing area. The alkyl and/or alkanol radicals result in quaternary ammonium ion 12 being larger, heavier, and less mobile than alkali metal cations. In the vicinity of polishing operations where such a quaternary ammonium base is employed, concentrations of ions capable of diffusing into semiconductor wafers are much lower than in areas where alkali metal bases are used. Therefore, if quaternary ammonium ion 12 can escape from a slurry and does migrate sufficiently far to contact a semiconductor wafer, it does not damage the wafer.

It should be noted that quaternary ammonium compounds are not very volatile, but it is possible carbonate salts could result from reactions with carbon dioxide that is in the atmosphere. Formation of the carbonate salts can be eliminated by providing an inert atmosphere, such as nitrogen, in the area surrounding wafer polishing operations.

Figure 2:
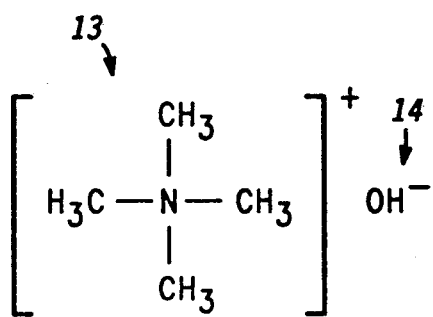
FIG. 2 is a schematic illustration of an embodiment of a tetramethyl ammonium hydroxide molecule that can be utilized in a semiconductor wafer polishing slurry in accordance with the present invention.

FIG. 2 is a schematic illustration of an embodiment of a tetramethyl ammonium hydroxide molecule. Tetramethyl ammonium hydroxide is a quaternary ammonium base that includes a tetramethyl ammonium ion 13 and a hydroxide ion 14. Tetramethyl ammonium ion 13 has four methyl radicals (—$CH_3$) for the radicals $R_1$ through $R_4$ shown in FIG. 1. Tetramethyl ammonium hydroxide dissociates to form a strong base that can be used to create a wafer polishing slurry that has high mass transfer at the removal interface. The methyl radicals used for $R_1$ through $R_4$ (see FIG. 1) form a large ion with limited mobility. Consequently, tetramethyl ammonium hydroxide facilitates creating a wafer polishing slurry that provides no substantial ionic contamination in a wafer processing area.

The structure of tetramethyl ammonium ion 13 is polar thereby increasing the ability of a slurry formed from tetramethyl ammonium hydroxide to wet a silicon wafer. Although surfactants are used to improve wetting properties of alkali metal bases, they are not necessarily required for a slurry that uses tetramethyl ammonium hydroxide as a base.

Tetrabutyl ammonium hydroxide is another similar compound that utilizes four butyl radicals (—$C_4H_9$) as $R_1$ through $R_4$ (see FIG. 1). Tetrabutyl ammonium hydroxide has properties that are similar to tetramethyl ammonium hydroxide although tetramethyl ammonium hydroxide is more common.

Figure 3:
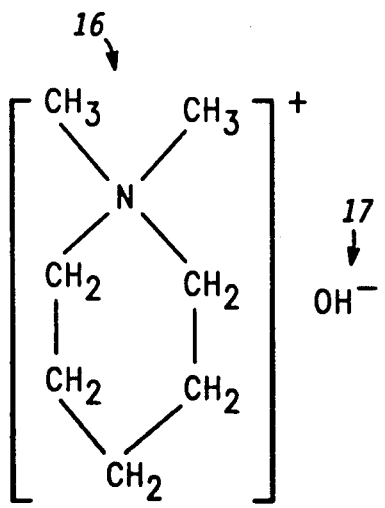
FIG. 3 is a schematic illustration of an embodiment of a quaternary ammonium base molecule having a nitrogen containing cyclic ring in accordance with the present invention.

Referring to FIG. 3, another quaternary ammonium ionic structure that can be utilized is a nitrogen containing cyclic compound. Such a cyclic compound has two of the radicals, such as $R_1$ and $R_2$ shown in FIG. 1, as part of the cyclic ring structure with the other radicals being alkyl and/or alkanol groups. Oxygen atoms could also be included in such a nitrogen containing cyclic ring structure. N, N-dimethyl piperidine hydroxide is an example of an aqueous quaternary ammonium base that includes a nitrogen containing cyclic ring. An embodiment of a molecule of N, N-dimethyl piperidine hydroxide that contains a quaternary ammonium ion 16 and a hydroxide ion 17 is schematically illustrated in FIG 3.

Figure 4:
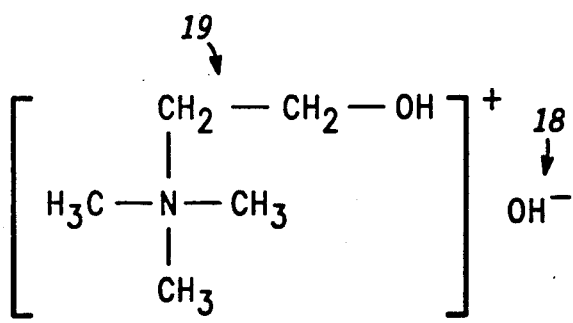
FIG. 4 is a schematic illustration of an embodiment of a choline molecule that can be used in the preferred embodiment of a semiconductor wafer polishing slurry in accordance with the present invention.

Referring to FIG. 4, choline is the preferred embodiment of an aqueous quaternary ammonium base for use in a wafer polishing slurry. An embodiment of a hydrolyzed choline molecule includes a positive quaternary ammonium ion 19 and a negative hydroxide ion ($OH^-$) 18. Quaternary ammonium ion 19 has three methyl radicals for $R_1$-$R_3$ shown in FIG. 1 and a beta-hydroxyethyl radical (—$CH_2$—$CH_2OH$) for $R_4$ (FIG. 1). The large beta-hydroxyethyl radical results in quaternary ammonium ion 19 having a lower mobility than tetramethyl ammonium ion 13 of FIG. 2. Additionally, the large beta-hydroxyethyl radical contains a hydroxide radical that increases the polar effect of quaternary ammonium ion 19. This polar property improves choline's ability to wet or spread over the surface of a polished silicon wafer thereby improving the ability to remove material from the wafer. Although the beta-hydroxyethyl radical is larger than the methyl radical shown in FIG. 2, choline provides high mass transfer at the interface between a slurry and a silicon wafer. The large size minimizes the ability of quaternary ammonium ion 19 to migrate within a wafer processing area and also prevents quaternary ammonium ion 19 from penetrating a silicon wafer. Consequently, choline provides no substantial contamination of a wafer processing area.

By now it should be appreciated that there has been provided a novel quaternary ammonium base compound for use in a semiconductor wafer polishing slurry. The quaternary ammonium base is devoid of metal cations that can contaminate wafers in a wafer processing area. Quaternary ammonium bases provide high mass transport of material removed from a wafer during polishing operations. Quaternary ammonium bases are nonvolatile strong bases that easily adjust the pH of a wafer polishing slurry. The large size of quaternary ammonium cations substantially eliminates ionic contamination of wafers in the area.

We claim:

1. A semiconductor wafer polishing slurry that does not contaminate a semiconductor wafer consisting essentially of:
   a plurality of fine abrasive particles;
   a quaternary ammonium compound of the form [N—($R_1R_2R_3R_4$)]$^+OH^-$ wherein $R_1$, $R_2$, $R_3$, and $R_4$ are radicals and at least two of the radicals are organic radicals; and water.

2. The slurry of claim 1 wherein the quaternary ammonium compound is tetramethyl ammonium hydroxide.

3. The slurry of claim 1 wherein the quaternary ammonium compound is tetrabutyl ammonium hydroxide.

4. The slurry of claim 1 wherein $R_1$, $R_2$, $R_3$, and $R_4$ are alkanols.

5. The slurry of claim 1 wherein the quaternary ammonium compound is N,N-dimethyl piperidine hydroxide.

6. The slurry of claim 1 wherein the quaternary ammonium compound is choline.

7. The slurry of claim 1 wherein the plurality of fine abrasive particles includes a plurality of fine silica particles.

8. A method of reducing the ionic contamination emitted by a semiconductor wafer polishing slurry comprising:
   providing a plurality of abrasive particles; and
   suspending the plurality of abrasive particles in an aqueous solution consisting essentially of water and a quaternary ammonium base having a hydroxide ion and a quaternary ammonium ion that includes at least two organic radicals.

9. The method of claim 8 wherein the suspending the plurality of abrasive particles includes suspending the plurality of abrasive particles in an aqueous solution of tetramethyl ammonium hydroxide.

10. The method of claim 8 wherein the suspending the plurality of abrasive particles includes suspending the plurality of abrasive particles in an aqueous solution of tetrabutyl ammonium hydroxide.

11. The method of claim 8 wherein the suspending the plurality of abrasive particles includes suspending the plurality of abrasive particles in an aqueous solution of choline.

12. A semiconductor wafer polishing slurry consisting essentially of:
    water;

an abrasive; and an organic base that has cations with low mobility which substantially eliminates migration of the cations from the slurry, and that has a size that is large enough to substantially eliminate penetration of the cations into a semiconductor wafer.

13. The wafer polishing slurry of claim 12 wherein the cation has the form $[N-(R_1R_2R_3R_4)]^+$.

14. The wafer polishing slurry of claim 12 wherein the organic base is choline.

15. The wafer polishing slurry of claim 12 wherein the organic base is tetramethyl ammonium hydroxide.

16. The wafer polishing slurry of claim 12 wherein the organic base includes a cation that has a nitrogen containing cyclic ring structure.

17. The wafer polishing slurry of claim 12 wherein the organic base is N,N-dimethyl piperidine hydroxide.

* * * * *